US011349056B2

(12) United States Patent
Sadayori

(10) Patent No.: US 11,349,056 B2
(45) Date of Patent: May 31, 2022

(54) METHOD OF PRODUCING SEMICONDUCTOR SINTERED BODY, ELECTRICAL/ELECTRONIC MEMBER, AND SEMICONDUCTOR SINTERED BODY

(71) Applicant: NITTO DENKO CORPORATION, Ibaraki (JP)

(72) Inventor: Naoki Sadayori, Baraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 264 days.

(21) Appl. No.: 16/613,561

(22) PCT Filed: May 17, 2018

(86) PCT No.: PCT/JP2018/019161
§ 371 (c)(1),
(2) Date: Nov. 14, 2019

(87) PCT Pub. No.: WO2018/212297
PCT Pub. Date: Nov. 22, 2018

(65) Prior Publication Data

US 2020/0075829 A1 Mar. 5, 2020

(30) Foreign Application Priority Data

May 19, 2017 (JP) ............................ JP2017-100107
May 19, 2017 (JP) ............................ JP2017-100108
Oct. 13, 2017 (JP) ............................ JP2017-199057

(51) Int. Cl.

| | |
|---|---|
| ***H01L 35/18*** | (2006.01) |
| ***C01B 33/06*** | (2006.01) |
| ***H01L 35/22*** | (2006.01) |
| ***H01L 35/34*** | (2006.01) |
| ***B28B 11/24*** | (2006.01) |
| ***H01L 35/26*** | (2006.01) |
| ***H01L 35/24*** | (2006.01) |
| ***H01L 35/28*** | (2006.01) |
| ***B22F 3/10*** | (2006.01) |
| ***B22F 3/105*** | (2006.01) |
| ***B82Y 30/00*** | (2011.01) |

(52) U.S. Cl.
CPC ............ *H01L 35/18* (2013.01); *B22F 3/1003* (2013.01); *B22F 3/105* (2013.01); *B28B 11/243* (2013.01); *C01B 33/06* (2013.01); *H01L 35/22* (2013.01); *H01L 35/24* (2013.01); *H01L 35/26* (2013.01); *H01L 35/28* (2013.01); *H01L 35/34* (2013.01); *B82Y 30/00* (2013.01); *C01P 2002/54* (2013.01); *C01P 2002/60* (2013.01); *C01P 2004/04* (2013.01); *C01P 2004/61* (2013.01); *C01P 2006/32* (2013.01); *C01P 2006/40* (2013.01)

(58) Field of Classification Search
CPC .... B22F 3/105; B22F 3/1003; C01P 2002/54; C01P 2004/61; C01B 33/06; H10L 35/34
See application file for complete search history.

(56) References Cited

U.S. PATENT DOCUMENTS

| | | | |
|---|---|---|---|
| 7,002,071 B1 | 2/2006 | Sadatomi et al. | |
| 2003/0032709 A1 | 2/2003 | Toshima et al. | |
| 2008/0173344 A1 | 7/2008 | Zhang et al. | |
| 2008/0202575 A1 | 8/2008 | Ren et al. | |
| 2010/0051081 A1* | 3/2010 | Iida | H01L 35/22 423/349 |
| 2012/0118343 A1 | 5/2012 | Iida et al. | |
| 2014/0116491 A1 | 5/2014 | Reifenberg et al. | |
| 2014/0360546 A1 | 12/2014 | Reifenberg et al. | |
| 2015/0069284 A1 | 3/2015 | Murai et al. | |
| 2015/0357543 A1 | 12/2015 | Yabuuchi et al. | |
| 2016/0072033 A1 | 3/2016 | Carberry | |
| 2016/0359096 A1 | 12/2016 | Yang et al. | |
| 2018/0033939 A1 | 2/2018 | Kwon et al. | |
| 2018/0212131 A1 | 7/2018 | Kikuchi et al. | |

FOREIGN PATENT DOCUMENTS

| | | | |
|---|---|---|---|
| CN | 101226983 | A | 7/2008 |
| EP | 1083610 | A1 | 3/2001 |
| JP | 2006-176859 | A | 7/2006 |
| JP | 2011-49538 | A | 3/2011 |
| JP | 2011-249742 | A | 12/2011 |
| JP | 2012-190984 | * | 10/2012 |
| JP | 2012-190984 | A | 10/2012 |
| JP | 2012-253229 | A | 12/2012 |
| JP | 2016-131232 | A | 7/2016 |
| JP | 2016-528716 | A | 9/2016 |

(Continued)

OTHER PUBLICATIONS

Kajikawa et al.. Thermoelectric Figure of Merit of Impurity Doped and Hot-pressed Magnesium Silicide Elements, 17th International Conference on Thermoelectrics (1998), Proceedings ICT98 (Cat. No 98TH8365), Date of Conference: May 28-28, 1998. pp. 362-369, cited in NPL No. 3.*

Office Action issued for related U.S. Appl. No. 16/612,466 dated Jul. 8, 2021.

Extended European Search Report issued for European Patent Application No. 18803227.0 dated Jan. 27, 2021.

Extended European Search Report issued for European Patent Application No. 18802437.6 dated Jan. 27, 2021.

Extended European Search Report issued for European Patent Application No. 18803228.8 dated Jan. 27, 2021.

Office Action issued for related U.S. Appl. No. 16/612,850 dated Mar. 23, 2021.

(Continued)

*Primary Examiner* — C Melissa Koslow
(74) *Attorney, Agent, or Firm* — Hauptman Ham, LLP

(57) ABSTRACT

A semiconductor sintered body comprising a polycrystalline body, wherein the polycrystalline body comprises magnesium silicide or an alloy containing magnesium silicide, and the average grain size of the crystal grains constituting the polycrystalline body is 1 μm or less, and the electrical conductivity is 10,000 S/m or higher.

5 Claims, 1 Drawing Sheet

(56) References Cited

FOREIGN PATENT DOCUMENTS

| | | | |
|---|---|---|---|
| JP | 2016-219666 | A | 12/2016 |
| WO | 2008/075789 | A1 | 6/2008 |
| WO | 2014/118959 | A1 | 8/2014 |
| WO | 2017/014583 | A1 | 1/2017 |
| WO | 2017/057237 | A1 | 4/2017 |

OTHER PUBLICATIONS

Sabah K. Bux et al., "Nanostructured Bulk Silicon as an Effective Thermoelectric Material", Advanced Functional Materials, 2009, p. 2445-p. 2452, vol. 19, InterScience, Weinheim, cited in the Specification.
Koya Arai et al., "Fabrication of Mg2Si bulk by spark plasma sintering method with Mg2Si nano-powder", Materials Research Society Symo, 2013, p. 63-p. 68, vol. 1490, DOI:10.1557/opl.2012.1732, Department of Materials Science and Technology, Japan.
International Search Report for corresponding international application PCT/JP2018/019159 dated Jul. 24, 2018.
International Search Report for corresponding international application PCT/JP2018/019160 dated Jul. 24, 2018.
International Search Report for corresponding international application PCT/JP2018/019161 dated Jul. 24, 2018.
Office Action dated Sep. 2, 2021 for corresponding Taiwanese Patent Application No. 107117015, along with an English translation.
Office Action dated Sep. 2, 2021 for corresponding Taiwanese Patent Application No. 107117013, along with an English translation.
Office Action dated Sep. 2, 2021 for corresponding Taiwanese Patent Application No. 107117012, along with an English translation.
Office Action dated Sep. 29, 2021 for co-pending U.S. Appl. No. 16/612,850.
Office Action dated Sep. 30, 2021 for co-pending U.S. Appl. No. 16/612,466.
Schieming et al., "Role of oxygen on microstructure and thermoelectric properties of silicon nanocomposites", Journal of Applied Physics 110, 113515 (2011), cited in NPL Nos. 1 and 2.
Kasiarova et al., "Microstructure and Creep Behavior of a Si3N4—SiC Micronanocomposite", Journal of the American Ceramic Society, vol. 92, No. 2, (2009), pp. 439-444, cited in NPL No. 2.
Zhu et al., "Increased Phonon Scattering by Nanograins and Point Defects in Nanostructured Silicon with a Low Concentration of Germanium", Physical Review Letters, 102, 196803 (2009), cited in NPL No. 2.
Office Action issued for related U.S. Appl. No. 16/612,466 dated Mar. 31, 2021.
Office Action dated Jan. 20, 2022 for co-pending U.S. Appl. No. 16/612,466.
Office Action dated Mar. 15, 2022 for corresponding Japanese Patent Application No. 2018-095174, along with an English machine translation.
Fiameni et al., "Synthesis and characterization of Bi-doped Mg2Si thermoelectric materials", Journal of Solid State Chemistry 193 (2012), pp. 142-146, cited in NPL No. 1.
Vivekanandhan et al., "Rapid in-situ synthesis of nanocrystalline magnesium silicide thermo-electric compound by spark plasma sintering", Materials Letters 197 (2017), pp. 106-110, cited in NPL No. 1.

* cited by examiner

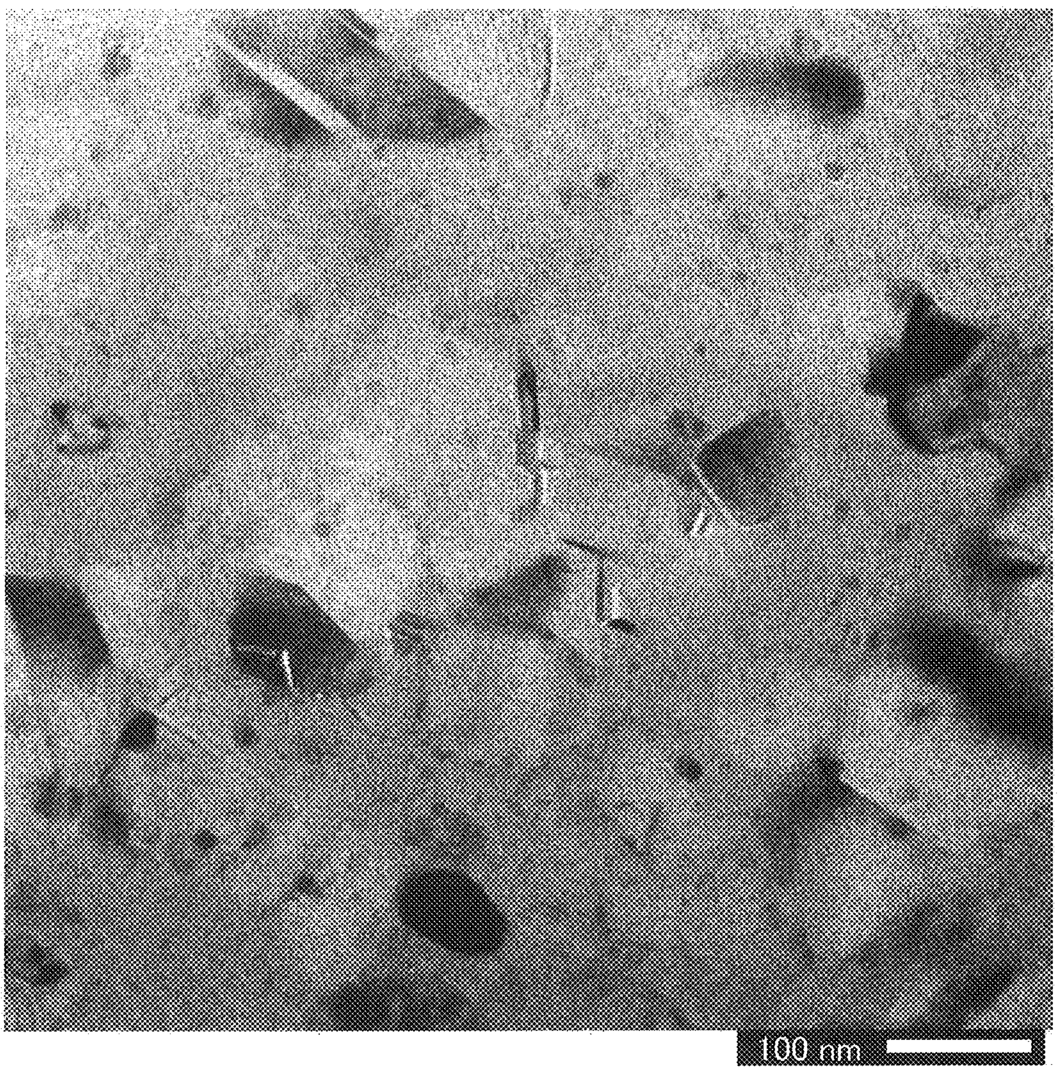
100 nm

METHOD OF PRODUCING SEMICONDUCTOR SINTERED BODY, ELECTRICAL/ELECTRONIC MEMBER, AND SEMICONDUCTOR SINTERED BODY

CROSS REFERENCE TO RELATED APPLICATION

This application claims the priority of Japanese Patent Application No. 2017-100107, filed on May 19, 2017 and Japanese Patent Application No. 2017-100108, filed on May 19, 2017 and Japanese Patent Application No. 2017-199057, filed on Oct. 13, 2017 in the JPO (Japanese Patent Office). Further, this application is the National Phase Application of International Application No. PCT/JP2018/019161, filed on May 17, 2018, which designates the United States and was published in Japan. Both of the priority documents are hereby incorporated by reference in their entireties.

TECHNICAL FIELD

The present invention relates to a method of producing a semiconductor sintered body, an electrical/electronic member, and a semiconductor sintered body.

BACKGROUND ART

Some semiconductors are known to generate a high electromotive force per temperature difference (i.e., have a high Seebeck coefficient), and thus to be useful thermoelectric materials for thermoelectric power generation. Among such semiconductors, silicon-based alloy materials have recently attracted attention due to their lower toxicity, availability at lower cost, and ease of controlling electrical properties.

To provide a higher thermoelectric performance, the thermoelectric material is required to have a higher electrical conductivity and a lower thermal conductivity. However, a silicon-based alloy has a high thermal conductivity, and therefore the silicon-based alloy material may not necessarily show sufficient thermoelectric performance.

In light of the above, nanostructuring by sintering nano-sized silicon particles, etc., which is a technique to reduce thermal conductivity, has been known (Patent Literature 1 and Non-Patent Literature 1). Further, also with regard to magnesium silicide, which is a silicon-based alloy, attempts have been made to obtain nanoparticles of the magnesium silicide and then sinter.

CITATION LIST

Patent Literature

Patent Literature 1: U.S. Patent Application Publication No. 2014/0360546

Non Patent Literature

Non Patent Literature 1: Bux et al., Adv. Funct. Mater., 2009, 19, pp. 2445-2452

Non Patent Literature 2: Arai et al., MRS Proceedings, 2013, 1490, pp. 63-68

SUMMARY OF INVENTION

Technical Problem

The nanostructuring as described in Patent Literature 1 and Non Patent Literatures 1, 2 can reduce the thermal conductivity of the material, but may also reduce the electrical conductivity. Therefore, the thermoelectric performance of the silicon-based material may still be insufficient.

In view of the above, it is an object of one embodiment of the present invention to provide a semiconductor material having an increased electrical conductivity and maintaining a reduced thermal conductivity, to achieve an improvement in the thermoelectric performance.

Solution to Problem

An embodiment of the present invention provides a semiconductor sintered body comprising a polycrystalline body, wherein the polycrystalline body includes magnesium silicide or an alloy containing magnesium silicide, an average particle size of crystal grains forming the polycrystalline body is 1 μm or less, and the semiconductor sintered body has an electrical conductivity of 10,000 S/m or more.

Advantageous Effects of Invention

According to an embodiment of the present invention, a semiconductor material having an increased electrical conductivity and maintaining a reduced thermal conductivity is provided to achieve an improvement in thermoelectric performance.

BRIEF DESCRIPTION OF DRAWINGS

FIG. 1 is a cross-sectional TEM image of a semiconductor sintered body obtained in Example 1.

DESCRIPTION OF EMBODIMENTS

Embodiments according to the present invention will now be described in more detail. The present invention is not limited to the embodiments described in the specification, and combinations and improvements of the embodiments can be appropriately made without departing from the technical idea of the invention.

(Semiconductor Sintered Body)

An embodiment of the present invention is a semiconductor sintered body including a polycrystalline body, wherein the polycrystalline body includes magnesium silicide or an alloy containing magnesium silicide, crystal grains forming the polycrystalline body have an average grain size of 1 μm or less, and the semiconductor sintered body has an electrical conductivity of 10,000 S/m or higher. Further, a semiconductor sintered body according to an embodiment of the present invention is a polycrystalline body including magnesium silicide or an alloy containing magnesium silicide, wherein crystal grains forming the polycrystalline body have an average grain size of 1 μm or less, and the semiconductor sintered body has an electrical conductivity of 10,000 S/m or higher.

For evaluating a thermoelectric performance (also referred to as thermoelectric conversion performance) of a thermoelectric material, a dimensionless thermoelectric performance index ZT[−] is generally used. The ZT is calculated by the following equation.

$$ZT=\alpha^2\sigma T/k \quad (1)$$

In the equation (1), α [V/K] represents a Seebeck coefficient, σ [S/m] represents an electric conductivity ("S" stands for Siemens and "m" stands for meter in the unit "S/m"), k [W/(mK)] represents a thermal conductivity, and T represents an absolute temperature [K]. The Seebeck coefficient α means an electrical potential difference generated per unit temperature difference. The larger the thermoelectric performance index ZT, the better the thermoelectric conversion performance. As is obvious from the equation (1), to improve the thermoelectric conversion performance ZT, a larger Seebeck coefficient α and a higher electrical conductivity σ, and a lower thermal conductivity k are desirable.

Magnesium silicide-based materials, i.e., magnesium silicide materials or alloy materials containing magnesium silicide, are known to have a high Seebeck coefficient α, and the above-described configuration according to the present embodiment can provide a semiconductor sintered body having a lower thermal conductivity k and a higher electrical conductivity σ, thereby improving the thermoelectric performance index ZT in equation (1). Further, magnesium silicide is less toxic and less expensive than materials such as $Bi_2Te_3$ and PbTe. Therefore, by using a semiconductor sintered body according to the present embodiment, it is possible to provide an environment-friendly thermoelectric conversion element (thermoelectric power generation element) and thus a thermoelectric power generation device at low cost. In addition, magnesium silicide materials or alloy materials containing magnesium silicide have an advantage of having a larger output factor (a product of the square of the Seebeck coefficient and the electrical conductivity, i.e., $\alpha^2\sigma$ in the above equation (1)) than a silicon material or other silicide material such as a silicon germanium material.

(Composition of Polycrystalline Body)

A semiconductor sintered body according to an embodiment of the present invention may be a polycrystalline body including magnesium silicide or an alloy including magnesium silicide, specifically, a polycrystalline body of magnesium, silicon, and other elements. Such a polycrystalline body may preferably be a magnesium silicide-based polycrystalline body, that is, a polycrystalline body including a magnesium silicide-based material as a main crystal. The main crystal means a crystal with a highest precipitation proportion in the XRD pattern or the like, and preferably is a crystal that accounts for 55% by mass or greater of the total polycrystalline body.

The polycrystalline body (semiconductor sintered body) may be obtained by melting one or more of: a mixture with an elemental substance of a raw material element; a compound including a raw material element; and a mixture thereof at a temperature of the melting point or higher, followed by cooling. The polycrystalline body (semiconductor sintered body) may also be obtained through a solid-phase diffusion reaction by raising the temperature to a temperature not high enough to cause melting under pressure. In the former method, an arc melting device or a high frequency melting device can be used, while in the latter method, an inert atmospheric furnace, a spark plasma sintering machine, a hot press machine, a hot isostatic pressing (HIP) sintering machine, or the like can be preferably used.

When the semiconductor sintered body is a polycrystalline body including an alloy including magnesium silicide, the polycrystalline body may be a solid solution, a eutectic body, or an intermetallic compound of magnesium silicide and an element other than magnesium and silicon. The element other than magnesium and silicon included in the alloy including magnesium silicide is not particularly limited as long as the element does not interfere with the effect of the present embodiment such that the electrical conductivity can be increased while maintaining the low thermal conductivity of the sintered body, and may include Ge, Fe, Cr, Ta, Nb, Cu, Mn, Mo, W, Ni, Ti, Zr, Hf, Co, Ir, Pt, Ru, Ba, C, Sn, and the like. Such element may be included alone or in combination of two or more in the alloy including magnesium silicide. Further, the alloy including magnesium silicide preferably includes 2 to 20% by mass of one or two or more of the above-mentioned elements other than silicon and magnesium. Specific examples of the magnesium silicide alloy may preferably be a magnesium-silicon-germanium alloy, a magnesium-silicon-tin alloy, and a magnesium-silicon-germanium-tin alloy. Among such alloys, the magnesium-silicon-tin alloy is more preferred in light of the electrical property and the thermal conductivity.

The semiconductor sintered body is a polycrystalline body having a so-called nanostructure, in which the average grain size of the crystal grains forming the polycrystalline body is 1 μm or less. Further, the average grain size of the crystal grains is preferably less than 1 μm, more preferably 800 nm or less, more preferably 500 nm or less, even more preferably 300 nm or less, and even more preferably 150 nm or less. Within the above range of the grain size of the crystal grains, the size of the crystal grains can be smaller than an average free path of phonons in the polycrystalline body, and thus the thermal conductivity can be reduced by phonon scattering at the interface.

Further, the lower limit of the average grain size of the crystal grains is not particularly limited if not restricted in the manufacture. That is, the lower limit of the average grain size of the crystal grains may be 1 nm or less if not restricted in the manufacture, but may be 1 nm or greater.

In the specification, the average grain size of the crystal grains means a median value of a longest diameter of individual crystal grains forming the crystalline body, directly measured in an observation by a microscope such as a scanning electron microscope (SEM) or a transmission electron microscope (TEM).

The electrical conductivity of the semiconductor sintered body may be 10,000 S/m or higher, preferably 15,000 S/m or higher, more preferably 20,000 S/m or higher, more preferably 30,000 S/m or higher, and even more preferably 40,000 S/m or higher. The above electrical conductivity may be a value at 27° C. Such enhancement in the electrical conductivity allows for improving the thermoelectric performance. Further, the upper limit of the electrical conductivity of the semiconductor sintered body may be 1,000,000 S/m or lower, and may be 500,000 S/m or lower at 27° C. The thermoelectric performance ZT may be, for example, 0.5 or higher, preferably 1.0 or higher, and more preferably 1.5 or higher at 527° C.

The thermal conductivity of the semiconductor sintered body according to the present embodiment is preferably 10 W/m·K or lower, and more preferably 5 W/m·K or lower. The above thermal conductivity may be a value at 27° C. Further, the absolute value of the Seebeck coefficient of the semiconductor sintered body is preferably 50 to 150 μV/K, and more preferably 80 to 120 μV/K. The above absolute value may be a value at 27° C.

(Dopant)

The semiconductor sintered body of the present embodiment may comprise an n-type dopant or a p-type dopant depending on usage. Preferably, the dopants are uniformly dispersed in the entire sintered body. The n-type dopant may preferably include phosphorus, arsenic, antimony, and bismuth, and these can be included in the semiconductor sintered body alone or in combination of two or more. The p-type dopant may preferably include boron, aluminum, gallium, indium, and thallium, and these can be included in the semiconductor sintered body alone or in combination of two or more. The conductivity types of the above-described dopant elements are merely examples. Whether the dopant element functions as an n-type dopant or p-type dopant depends on the type of the element forming the parent crystal, the structure of the crystal, etc. in the resulting sintered body.

In the case of the n-type dopant, the dopant concentration in the sintered body is preferably 0.1 to 10, and more preferably 0.5 to 5 in terms of [$10^{20}$ atoms/$cm^3$]. In the case of the p-type dopant, the dopant concentration in the sintered body is preferably 0.1 to 10, and more preferably 0.5 to 5 in terms of [$10^{20}$ atoms/$cm^3$]. The increased dopant concentration enables to enhance the electrical conductivity, and thus improve the thermoelectric performance ZT. However, when the dopant concentration is excessively high, the Seebeck coefficient may be decreased and the thermal conductivity may be increased, and thus the thermoelectric performance ZT may be decreased. However, the above range of the dopant concentration can improve the thermoelectric performance ZT.

The n-type dopant is preferably included at a concentration such that the Seebeck coefficient of the semiconductor sintered body is maintained in the range of −185 to −60 μV/K. The p-type dopant is preferably included at such concentration that the Seebeck coefficient of the semiconductor sintered body is maintained in the range of 60 to 185 μV/K.

(Electrical and Electronic Material)

As described above, according to the present embodiment, a semiconductor sintered body can be provided, which has an increased electrical conductivity while maintaining a low thermal conductivity. Accordingly, the semiconductor sintered body can be used as an electrical member and/or an electronic member, a thermoelectric element in particular. More specifically, the semiconductor sintered body can be preferably used in a power generation device using exhaust heat, including a power generation device mounted on a generator or an exhaust system of an automobile or a ship, a power generation device mounted on a heat radiation system of a heating furnace used for industrial purposes, and the like.

(Method of Producing Semiconductor Sintered Body)

A method of producing a semiconductor sintered body according to the present embodiment comprises steps of: preparing particles including magnesium silicide or an alloy including magnesium silicide and having an average particle size of 1 μm or less; forming a coating of an organic compound or an organic mixture including a dopant element, on a surface of the particles; and sintering the particles with the coating formed to obtain a semiconductor sintered body.

The step of preparing particles may include obtaining a solid by melting one or more of a mixture with an elemental substance of a raw material element, a compound including a raw material element, and a mixture thereof at a temperature of the melting point or higher, followed by cooling. The step of preparing particles may also include obtaining a solid through a solid-phase diffusion reaction by raising the temperature to a temperature not high enough to melt under pressure. In the former method, an arc melting device or a high frequency melting device can be used, while in the latter method, an inert atmospheric furnace, a spark plasma sintering machine, a hot press machine, a hot isostatic pressing (HIP) sintering machine, or the like can be preferably used. The latter method is preferred in that a uniform composition can be obtained.

The step of preparing particles further includes pulverizing the obtained solid by a known pulverizing method to prepare the particles (powder) with an average particle size of 1 μm or less. Further, a known crystal growth method such as chemical vapor deposition (CVD) may also be used to synthesize the particles (powder) from a raw material of magnesium silicide or an alloy including magnesium silicide.

The average particle size obtained in the step of preparing particles is preferably less than 1 μm, more preferably 800 nm or less, more preferably 500 nm or less, and even more preferably 300 nm or less. Further, the D90 size of the particles may be 1 μm or less, preferably 500 nm or less, and more preferably 200 nm or less. The above-described range of the particle size of the particles before sintering may result in a sintered body that includes crystal grains having a grain size of 1 μm or less and is appropriately densified. The lower limit of the average particle size to be prepared in the step of preparing particles is not limited, but the average particle size may preferably be 10 nm or greater in light of restriction in the manufacture. In the specification, the average particle size of the particles can be defined as a median diameter on a volumetric basis measured by a laser diffraction particle size distribution measuring device.

Subsequently, the step of forming a coating of an organic compound including a dopant element on the surface of the particles obtained in the step of preparing particles is performed. The step of forming a coating can be performed by dispersing the particles obtained in the step of preparing particles in a solvent, adding an organic compound including the above-described dopant element or an organic mixture (a mixture containing an organic compound including a dopant element), and mixing by a bead mill or the like. Thereafter, the solvent is removed by decompression or the like, followed by drying to obtain particles with a coating of the organic compound including the dopant element formed on the surface. The coating may have a thickness of 0.5 to 5 nm, and preferably be a monomolecular film of the organic compound. Alternatively, a coating may be formed by diffusing an organic compound in a gas.

The dopant element to be included in the organic compound or an organic mixture may be an n-type or p-type dopant element depending on the usage. The n-type dopant element may be one or more elements selected from phosphorus, aluminum, arsenic, antimony, and bismuth. The p-type dopant element may be one or more elements selected from lithium, boron, gallium, indium, and thallium.

The organic compound including the dopant element may be a high-molecular weight compound or a low-molecular weight compound. The organic compound may be a hydride, an oxide, an oxo acid, or the like. Further, the organic mixture may be a mixture of an organic compound containing a dopant element and another organic compound, or a mixture of an inorganic compound containing a dopant element and an organic compound.

When phosphorus is used as an n-type dopant element, the organic compound may be phosphoric acid, an alkylphosphonic acid, an alkylphosphinic acid, and esters thereof, a polyvinylphosphonic acid, phosphine, a trialkylphosphine such as triethylphosphine or tributylphosphine, or the like. Polymers including a phosphonic acid (phosphonic acid polymers) may also be used. When arsenic is used as the dopant element, arsine or the like may be used. In the case of antimony, antimony trioxide or the like may be used. In the case of bismuth, bismuth acid or the like may be used.

When boron is used as the p-type dopant element, a borane cluster such as decaborane or ortho-decaborane, boron trifluoride, or the like may be used. Further, when aluminum is used as the dopant element, aluminum trichloride, trimethylaluminum, or the like may be used. In the case of gallium, gallium trichloride, trimethylgallium, or the like may be used. In the case of indium, indium trichloride or the like may be used. In the case of thallium, thallium chloride or the like may be used.

The compounds may be used alone or in combination of two or more. In addition, when the above-mentioned compound is inorganic, a mixture of the above-mentioned inorganic substance and an organic compound may be used.

In the step of forming a coating, the organic compound including the dopant element may be added in an amount of preferably 3 to 60 parts by mass, more preferably 10 to 30 parts by mass, with respect to 100 parts by mass of the particles prepared in the step of preparing particles.

The method for the step of sintering may not be limited as long as the above-described raw particles (powder) can be sintered, but may include spark plasma sintering (SPS), atmospheric sintering (two step sintering), pressure sintering (hot pressing), hot isometric pressing (HIP), microwave sintering, and the like. Among such methods, the spark plasma sintering is preferred, which can produce smaller crystal grains.

The sintering temperature in the step of sintering may be selected depending on the composition of the main crystal of magnesium silicide or an alloy including magnesium silicide to be obtained, but is preferably 500° C. or higher, and more preferably 600° C. or higher. Further, the sintering temperature is preferably 900° C. or lower, and more preferably 800° C. or lower. The above range of the temperature can promote a densification of the sintered body, and maintain the average grain size of the polycrystalline grain of 1 μm or less.

Further, a rate of temperature rise in the step of sintering is preferably 10 to 100° C./minute, and more preferably 20 to 60° C./minute. The range of the rate of temperature rise enables to facilitate a uniform sintering and to suppress an excessively rapid grain growth to maintain the average grain size of the polycrystalline grains of 1 μm or less.

In the step of sintering, pressure is preferably applied. In that case, the pressure to be applied is preferably 10 to 120 MPa, and more preferably 30 to 100 MPa.

An embodiment of the present invention is a semiconductor sintered body produced by preparing particles including magnesium silicide or an alloy including magnesium silicide and having an average particle size of 1 μm or less; forming a coating of an organic compound including a dopant element on a surface of the particles; and sintering the particles with the coating formed on the surface to obtain a semiconductor sintered body. Such a semiconductor sintered body has a high electrical conductivity while maintaining a low thermal conductivity. Therefore, a semiconductor sintered body having a high thermoelectric performance ZT can be provided.

As described above, by sintering (calcining) the particles with the coating including dopant elements on the surface, the dopant elements are thermo-diffused from the interface between the particles to the interior of the particles. Such doping by the thermodiffusion from the particle interface can improve the resulting electrical conductivity of the sintered body. Further, the semiconductor sintered body obtained by the method according to the present embodiment may also exhibit a higher electrical conductivity, compared to a sintered body having an equivalent dopant concentration but having been doped without utilizing thermodiffusion from the particle interface.

As described above, in the method according to the present embodiment, the doping is performed by incorporating the dopant element in the coating in the step of forming a coating, and thermodiffusing the dopants from the particle interface in the sintering step. However, dopants may additionally be incorporated in the particles in the step of preparing particles, followed by the above-described step of forming a coating. For example, at a stage of melting a material of magnesium silicide or an alloy including magnesium silicide that is to be a main crystal, an elemental substance or a compound of the dopant element may be added and mixed, and then the obtained particles (powder) may be cooled and ground, to prepare particles (powder) containing a dopant. Alternatively, powder of magnesium silicide or an alloy including magnesium silicide may be reacted with powder of an elemental substance or compound of a dopant element through a solid-phase diffusion at a temperature not high enough to cause melting under applied pressure to obtain a mass, and then the mass is ground to prepare the particles. Further, when particles are prepared using a chemical vapor deposition (CVD) or the like, a raw material of magnesium silicide or an alloy including magnesium silicide and an elemental substance of a dopant element or compound thereof may be mixed in a gas phase, and then condensed to prepare particles containing a dopant.

In the above-described manner, a higher doping concentration is achieved by incorporating dopants in the step of preparing particles, and then thermodiffusing the dopants from the particle surface into the inside of the particles in the step of forming a coating and the step of sintering.

EXAMPLES

[N-Type Semiconductor Sintered Body]

Example 1

(Preparation of Magnesium Silicide Particles)

23 g of magnesium silicide (purity: 99.99% or higher) and 1.9 g of bismuth (purity: 99.9%) were loaded into a punch-die jig made of graphite, a pressure heat treatment was applied under an argon atmosphere for 10 minutes at 700° C. using a spark plasma sintering apparatus, followed by cooling. The resulting mass was crushed to a size of 45 μm or less using a hammer crusher and a planetary ball mill. Further, a bead mill was used to pulverize to have a D90 size of approximately 150 nm. In the pulverizing, isopropyl alcohol was used as a medium, and zirconia beads with a diameter of 0.05 mm were used as the beads. Isopropyl alcohol was removed from the resulting slurry under reduced pressure followed by drying to provide magnesium silicide particles doped with bismuth.

(Coating of Particles)

The resulting magnesium silicide particles were dispersed in heptane, and then polyvinylphosphonic acid (No. 661740 from Sigma Aldrich Co. Ltd.) was added in an amount of 0.4 g with respect to 5.0 g of magnesium silicide particles to obtain a mixture. The mixture was loaded in the above bead mill, and the mixing process was performed for 300 minutes. The heptane was then removed under reduced pressure followed by drying to provide magnesium silicide particles coated with a monomolecular film.

(Sintering)

The magnesium silicide particles coated with the monomolecular film were loaded into a punch-die jig made of graphite, and then heated to 750° C. using a spark plasma sintering device to obtain a sintered body. The applied pressure was 50 MPa, and the rate of temperature rise was 50° C./minute. The surface of the sintered body was roughly polished to remove the impurity layer originated from the graphite or the like. The sintered body was cut by using a dicing saw to obtain a rectangular parallelepiped chip.

(Structure and Properties)

The density of the sintered body measured by Archimedes method was 98.5% with respect to pure magnesium silicide. Further, a cross-section of the sintered body was observed under a transmission electron microscope (TEM), and a structure in which magnesium silicide crystal grains with an average particle diameter of 100 nm were tightly bonded was observed (FIG. 1).

The sintered body had an electrical conductivity of 1.1×$10^5$ S/m at 27° C., and a thermal conductivity of 8.5 W/m·K. The dopant concentration was calculated based on the Seebeck coefficient (−101.1 μV/K) of the sintered body, and was 0.8 in terms of [$10^{20}$ atoms/$cm^3$]. The thermoelectric performance index ZT at 527° C. was 0.86.

Example 2

(Preparation of Magnesium Silicide Particles)

Magnesium silicide particles were prepared as in Example 1.

(Coating of Particles)

Magnesium silicide particles coated with a monomolecular film were obtained in the same manner as Example 1, except that the mixture contained 0.7 g of tributylphosphine, instead of 0.4 g of polyvinylphosphonic acid.

(Sintering)

In the same manner as in Example 1, a sintered body was obtained by sintering the magnesium silicide particles coated with the monomolecular film, and a rectangular parallelepiped chip was obtained.

(Structure and Properties)

The density of the sintered body measured by Archimedes method was 98.5% with respect to the pure magnesium silicide. A cross-section of the sintered body was observed under a transmission electron microscope (TEM), and a structure was observed in which magnesium silicide particles with an average particle diameter of 100 nm were tightly bonded.

The sintered body had an electrical conductivity of 1.0×$10^5$ S/m at 27° C., and a thermal conductivity of 8.0 W/m·K. The dopant concentration was calculated based on the Seebeck coefficient of the sintered body (−100.9 μV/K), and was 0.8 in terms of [$10^{20}$ atoms/$cm^3$]. The thermoelectric performance index ZT at 527° C. was 0.87.

Example 3

(Preparation of Magnesium Silicide Particles)

Magnesium silicide particles were prepared in the same manner as in Example 1.

(Coating of Particles)

In the same manner as Example 1, magnesium silicide particles coated with a monomolecular film were obtained except that the mixture contained 0.4 g of methylphosphonic acid, instead of 0.4 g of polyvinyl phosphonic acid.

(Sintering)

In the same manner as in Example 1, a sintered body was obtained by sintering the magnesium silicide particles coated with the monomolecular film, and a rectangular parallelepiped chip was obtained.

(Structure and Properties)

The density of the sintered body measured by Archimedes method was 98.5% with respect to the pure magnesium silicide. In addition, a cross-section of the sintered body was observed under a transmission electron microscope (TEM), and a structure in which magnesium silicide crystal grains with an average particle size of 100 nm were tightly bonded was observed.

The sintered body had an electrical conductivity of 1.2×$10^5$ S/m at 27° C., and a thermal conductivity of 8.5 W/m·K. The dopant concentration was calculated based on the Seebeck coefficient of the sintered body (−101.5 μV/K) and was 0.8 in terms of [$10^{20}$ atoms/$cm^3$]. The thermoelectric performance index ZT at 527° C. was 0.88.

Example 1A (Preparation of Magnesium Silicide Particles)

Magnesium silicide particles were prepared in the same manner as in Example 1.

(Coating of Particles)

In the same manner as Example 1, magnesium silicide particles coated with a monomolecular film were obtained, except that a mixture contained 0.4 g of polyvinyl phosphonic acid and 0.5 g of a phosphonic acid polymer mixture (phosphorus content: 22 wt %, developed by Nitto Denko Corporation, No. DB 81) was used.

(Sintering)

In the same manner as in Example 1, a sintered body was obtained by sintering magnesium silicide particles coated with a monomolecular film, and a rectangular parallelepiped chip was obtained.

(Structure and Properties)

The density of the sintered body measured by Archimedes method was 98.5% with respect to pure magnesium silicide. In addition, a cross-section of the sintered body was observed under a transmission electron microscope (TEM), and a structure in which magnesium silicide crystal grains with an average particle size of 100 nm were tightly bonded was observed.

The sintered body had an electrical conductivity of 1.4×$10^5$ S/m at 27° C., and a thermal conductivity of 8.3 W/m·K. The dopant concentration was calculated based on the Seebeck coefficient (−98.1 μV/K) of the sintered body, and was 1.1 in terms of [$10^{20}$ atoms/$cm^3$]. The thermoelectric performance index ZT at 527° C. was 0.89.

Example 4

(Preparation of Magnesium Silicide Particles)

Magnesium silicide particles were obtained in the same manner as Example 1 except that 1.1 g of antimony (purity: 99.9%) was used instead of 1.0 g of bismuth (purity: 99.9%).

(Coating of Particles)

In the same manner as in Example 1, magnesium silicide particles coated with a monomolecular film were obtained.

(Sintering)

In the same manner as in Example 1, a sintered body was obtained by sintering the magnesium silicide particles coated with the monomolecular film, and a rectangular parallelepiped chip was obtained.

(Structure and Properties)

The density of the sintered body measured by Archimedes method was 98.5% with respect to pure magnesium silicide. In addition, a cross-section of the sintered body was observed under a transmission electron microscope (TEM), and a structure was observed in which magnesium silicide crystal grains with an average particle size of 100 nm were tightly bonded.

The sintered body had an electrical conductivity of 1.0×$10^5$ S/m at 27° C., and a thermal conductivity of 9.0 W/m·K. The dopant concentration was calculated based on the Seebeck coefficient (−99.5 μV/K) of the sintered substance, and was 0.8 in terms of [$10^{20}$ atoms/$cm^3$]. The thermoelectric performance index ZT at 527° C. was 0.80.

Example 5

(Preparation of Magnesium Silicide Particles)

Magnesium silicide particles were obtained in the same manner as Example 1 except that 0.7 g of arsenic (purity: 99.9%) was used instead of 1.0 g of bismuth (purity: 99.9%).

(Coating of Particles)

In the same manner as in Example 1, magnesium silicide particles coated with a monomolecular film were obtained.

(Sintering)

In the same manner as in Example 1, a sintered body was obtained by sintering the magnesium silicide particles coated with the monomolecular film, and a rectangular parallelepiped chip was obtained.

(Structure and Properties)

The density of the sintered body measured by Archimedes method was 98.5% with respect to the pure magnesium silicide. In addition, a cross-section of the sintered body was observed under a transmission electron microscope (TEM), and a structure was observed in which magnesium silicide crystal grains with an average particle size of 100 nm were tightly bonded.

The sintered body had an electrical conductivity of 1.0×$10^5$ S/m at 27° C., and a thermal conductivity of 8.6 W/m·K. The dopant concentration was calculated based on the Seebeck coefficient (−99.9 μV/K) of the sintered substance, and was 0.8 in terms of [$10^{20}$ atoms/$cm^3$]. The thermoelectric performance index ZT at 527° C. was 0.81.

Example 6

(Preparation of Magnesium Silicide Alloy Particles)

15 g of magnesium (purity: 99.99% or higher), 3.4 g of silicon (purity: 99.99% or higher), 21 g of tin (purity: 99.99% or higher), and 1.9 g of bismuth (purity: 99.9%) were loaded into a punch-die jig made of graphite, a pressure heat treatment was applied under an argon atmosphere for 10 minutes at 50 MPa and 700° C. using a spark plasma sintering device, followed by cooling. The resulting mass was crushed to a size of 45 μm or less using a hammer crusher and a planetary ball mill. Further, a bead mill was used to pulverize to have a D90 size of approximately 150 nm. In the pulverizing, isopropyl alcohol was used as a medium, and zirconia beads with a diameter of 0.05 mm were used as the beads. Isopropyl alcohol was removed from the resulting slurry under reduced pressure followed by drying to provide bismuth-doped magnesium silicide particles.

(Coating of Particles)

The resulting magnesium silicide alloy particles were dispersed in heptane, and polyvinylphosphonic acid (Sigma Aldrich) was added in an amount of 0.4 g with respect to 5.0 g of the particles to obtain a mixture. The mixture was loaded in the above-mentioned bead mill, and the mixing process was performed for 300 minutes. The heptane was then removed under reduced pressure followed by drying to obtain particles of a magnesium silicide-based alloy coated with a monomolecular film.

(Sintering)

The magnesium silicide alloy particles coated with the monomolecular film were loaded in a punch-die jig made of graphite, and then heated to 750° C. using a spark plasma sintering device to obtain a sintered body. The applied pressure was 50 MPa, and the rate of temperature rise was 50° C./minute. The surface of the sintered body was roughly polished to remove the impurity layer originated from graphite or the like. The sintered body was cut by using a dicing saw to obtain a rectangular parallelepiped chip.

(Structure and Properties)

The density of the sintered body measured by Archimedes method was 98.5% with respect to the density of the magnesium silicide alloy used as raw material. In addition, a cross-section of the sintered body was observed under a transmission electron microscope (TEM), and a structure was observed in which crystalline grains with an average grain diameter of 100 nm were tightly bonded.

The sintered body had an electrical conductivity of 1.4×$10^5$ S/m at 27° C., and a thermal conductivity of 5.5 W/m·K. The dopant concentration was calculated based on the Seebeck coefficient (−119.2 μV/K) for the sintered body, and was 2.6 in terms of [$10^{20}$ atoms/$cm^3$]. The thermoelectric performance index ZT at 527° C. was 1.22.

Example 6A (Preparation of Magnesium Silicide Particles)

Magnesium silicide alloy particles were prepared in the same manner as in Example 6.

(Coating of Particles)

In the same manner as Example 6, magnesium silicide-based alloy particles coated with a monomolecular film were obtained, except that the mixture contained 0.5 g of a phosphonic acid polymer mixture (phosphorous content: 22 wt %, developed by Nitto Denko Corporation, No. DB 81), instead of 0.4 g of polyvinylphosphonic acid.

(Sintering)

In the same manner as Example 6, the magnesium silicide-based alloy particles coated with a monomolecular film were sintered to obtain the sintered body, and a rectangular parallelepiped chip was obtained.

(Structure and Properties)

The density of the sintered body measured by Archimedes method was 98.5% with respect to the base magnesium silicide alloy. In addition, a cross-section of the sintered body was observed under a transmission electron microscope (TEM), and a structure was observed in which crystalline grains with an average grain diameter of 100 nm were tightly bonded.

The sintered body had an electrical conductivity of 1.6×$10^5$ S/m at 27° C., and a thermal conductivity of 5.3 W/m·K. The dopant concentration was calculated based on the Seebeck coefficient (−106.1 μV/K) of the sintered substance and was 2.6 in terms of [$10^{20}$ atoms/$cm^3$]. The thermoelectric performance index ZT at 527° C. was 1.31.

Example 7

(Preparation of Magnesium Silicide Alloy Particles)

15 g of magnesium (purity: 99.99% or higher), 3.4 g of silicon nanoparticles (XRD crystallite size: 18 nm), 21 g of tin (purity: 99.99% or higher), and 1.9 g of bismuth (purity: 99.9%) were loaded in a punch-die jig made of graphite, a pressure heat treatment was applied under an argon atmosphere using a spark plasma sintering device, followed by cooling. The resulting mass was crushed to a size of 45 μm or less using a hammer crusher and a planetary ball mill. Further, a bead mill was used to pulverize to have a D90 size of approximately 150 nm. In the pulverizing, isopropyl alcohol was used as a medium, and zirconia beads with a diameter of 0.05 mm were used as the beads. Isopropyl alcohol was removed from the resulting slurry under reduced pressure followed by drying to provide bismuth-doped magnesium silicide particles.

(Coating of Particles)

The resulting magnesium silicide alloy particles were dispersed in heptane, and then polyvinylphosphonic acid (Sigma Aldrich) was added in an amount of 0.4 g with respect to 5.0 g of the particles to obtain a mixture. The mixture was loaded in the above-mentioned bead mill, and the mixing process was performed for 300 minutes. The heptane was then removed under reduced pressure followed by drying to obtain particles of a magnesium silicide-based alloy coated with a monomolecular film.

(Sintering)

The particles of the monomolecular film coated magnesium silicide alloy were loaded in a punch-die jig made of graphite, and then heated to 750° C. using a spark plasma sintering device to obtain a sintered body. The applied pressure was 50 MPa, and the rate of temperature rise was 50° C./minute. The surface of the sintered body was roughly polished to remove the impurity layer originated from graphite or the like. The sintered body was cut by using a dicing saw to obtain a rectangular parallelepiped chip.

(Structure and Properties)

The density of the sintered body measured by Archimedes method was 98.5% with respect to the base magnesium silicide alloy. In addition, a cross-section of the sintered body was observed under a transmission electron microscope (TEM), and a structure was observed in which crystalline grains with an average grain diameter of 100 nm were tightly bonded.

The sintered body had an electrical conductivity of $1.5\times10^5$ S/m at 27° C., and a thermal conductivity of 3.8 W/m·K. The dopant concentration was calculated based on the Seebeck coefficient (−120.4 μV/K) of the sintered substance, and was 2.2 in terms of [$10^{20}$ atoms/$cm^3$]. The thermoelectric performance index ZT at 527° C. was 1.31.

Example 8

(Preparation of Magnesium Silicide Alloy Particles)

15 g of magnesium (purity: 99.99% or higher), 6.0 g of silicon-germanium alloy (purity: 99.99% or higher), 21 g of tin (purity: 99.99% or higher), and 1.9 g of bismuth (purity: 99.9%) were loaded in a punch-die jig made of graphite, a pressure heat treatment was applied under an argon atmosphere using a spark plasma sintering device, followed by cooling. The resulting mass was crushed to a size of 45 μm or less using a hammer crusher and a planetary ball mill. Further, a bead mill was used to pulverize to have a D90 size of approximately 150 nm. In the pulverizing, isopropyl alcohol was used as a medium, and zirconia beads with a diameter of 0.05 mm were used as the beads. Isopropyl alcohol was removed from the resulting slurry under reduced pressure followed by drying to provide bismuth-doped magnesium silicide particles.

(Coating of Particles)

The resulting magnesium silicide alloy particles were dispersed in heptane, and polyvinylphosphonic acid (Sigma Aldrich) was added in an amount of 1.0 g with respect to 5.0 g of the particles to obtain a mixture. The mixture was loaded in the above-described bead mill, and the mixing process was performed for 300 minutes. The heptane was then removed under reduced pressure followed by drying to obtain particles of a magnesium silicide-based alloy coated with a monomolecular film.

(Sintering)

Particles of the above monomolecular film coated magnesium silicide alloy were loaded into a punch-die jig made of graphite and heated to 750° C. using a spark plasma sintering device to obtain a sintered body. The applied pressure was 50 MPa, and the rate of temperature rise was 50° C./minute. The surface of the sintered body was roughly polished to remove the impurity layer originated from graphite or the like.

The sintered body was cut by using a dicing saw to obtain a rectangular parallelepiped chip.

(Structure and Properties)

The density of the sintered body measured by Archimedes method was 98.5% with respect to the base magnesium silicide alloy. In addition, a cross-section of the sintered body was observed under a transmission electron microscope (TEM), and a structure was observed in which crystalline grains with an average grain diameter of 100 nm were tightly bonded.

The sintered body had an electrical conductivity of $1.3\times10^5$ S/m at 27° C., and a thermal conductivity of 4.8 W/m·K. The dopant concentration was calculated based on the Seebeck coefficient (−120.4 μV/K) of the sintered substance and was 2.2 in terms of [$10^{20}$ atoms/$cm^3$]. The thermoelectric performance index ZT at 527° C. was 1.18.

[P-Type Sintered Body]

Example 9

(Preparation of Magnesium Silicide Particles)

23 g of a magnesium silicide (purity: 99.99% or higher) and 0.3 g of lithium (purity: 99.9%) were loaded in a punch-die jig made of graphite, a pressure heat treatment was applied under an argon atmosphere using a spark plasma sintering device, followed by cooling. The resulting mass was crushed to a size of 45 μm or less using a hammer crusher and a planetary ball mill. Further, a bead mill was used to pulverize to have a D90 size of approximately 150 nm. In the pulverizing, isopropyl alcohol was used as a medium, and zirconia beads with a diameter of 0.05 mm were used as the beads. Isopropyl alcohol was removed from the resulting slurry under reduced pressure followed by drying to provide bismuth-doped magnesium silicide particles.

(Coating of Particles)

The resulting magnesium silicide particles were dispersed in heptane, and decaborane was added in an amount of 0.3 g with respect to 5.0 g of magnesium silicide particles to obtain a mixture. The mixture was loaded in the above-described bead mill, and the mixing process was performed for 300 minutes. The heptane was then removed under reduced pressure followed by drying to provide magnesium silicide particles coated with a monomolecular film.

(Sintering)

The magnesium silicide particles coated with the monomolecular film were loaded in a punch-die jig made of graphite, and then heated to 750° C. using a spark plasma sintering device to obtain a sintered body. The applied pressure was 50 MPa, and the rate of temperature rise was 50° C./minute. The surface of the sintered body was roughly polished to remove the impurity layer originated from graphite or the like. The sintered body was cut by using a dicing saw to obtain a rectangular parallelepiped chip.

(Structure and Properties)

The density of sintered body measured by Archimedes method was 98.5% with respect to the pure magnesium silicide. In addition, a cross-section of the sintered body was observed under a transmission electron microscope (TEM), and a structure was observed in which magnesium silicide crystal grains with an average particle size of 100 nm were tightly bonded.

The sintered body had an electrical conductivity of 1.1×$10^5$ S/m at 27° C., and a thermal conductivity of 8.6 W/m·K. The dopant concentration was calculated based on the Seebeck coefficient of the sintered body (99.2 μV/K), and was 0.8 in terms of [$10^{20}$ atoms/$cm^3$]. The thermoelectric performance index ZT at 527° C. was 0.77.

Example 10

(Preparation of Magnesium Silicide Particles)

Magnesium silicide particles were prepared as in Example 9.

(Coating of Particles)

Magnesium silicide particles coated with a monomolecular film were obtained in the same manner as Example 9, except that a mixture contained 1.0 g of tributylborane was used instead of 0.3 g of decaborane.

(Sintering)

In the same manner as in Example 9, the magnesium silicide particles coated with the monomolecular film were sintered to obtain a sintered body, and a rectangular parallelepiped chip was obtained.

(Structure and Properties)

The density of sintered body measured by Archimedes method was 98.5% with respect to pure magnesium silicide. In addition, a cross-section of the sintered body was observed under a transmission electron microscope (TEM), and a structure in which magnesium silicide particles with an average particle diameter of 100 nm were tightly bonded was observed.

The sintered body had an electrical conductivity of 1.0×$10^5$ S/m at 27° C., and a thermal conductivity of 9.0 W/m·K. The dopant concentration was calculated based on the Seebeck coefficient of the sintered body (100.5 μV/K), and was 0.8 in terms of [$10^{20}$ atoms/$cm^3$]. The thermoelectric performance index ZT at 527° C. was 0.81.

Example 11

(Preparation of Magnesium Silicide Particles)

Magnesium silicide particles were obtained in the same manner as in Example 9, except that 0.6 g of gallium (purity: 99.9%) was used instead of 0.3 g of lithium (purity: 99.9%).

(Coating of Particles)

In the same manner as in Example 9, magnesium silicide particles coated with a monomolecular film were obtained.

(Sintering)

In the same manner as in Example 9, the magnesium silicide particles coated with a monomolecular film were sintered to obtain a sintered body, and a rectangular parallelepiped chip was obtained.

(Structure and Properties)

The density of the sintered body measured by Archimedes method was 98.5% with respect to the pure magnesium silicide. In addition, a cross-section of the sintered body was observed under a transmission electron microscope (TEM), and a structure was observed in which magnesium silicide crystal grains with an average particle size of 100 nm were tightly bonded.

The sintered body had an electrical conductivity of 1.0×$10^5$ S/m at 27° C., and a thermal conductivity of 7.9 W/m·K. The dopant concentration was calculated based on the Seebeck coefficient of the sintered body (100.1 μV/K), and was 0.8 in terms of [$10^{20}$ atoms/$cm^3$]. The thermoelectric performance index ZT at 527° C. was 0.85.

Example 12

(Preparation of Magnesium Silicide Particles)

Magnesium silicide particles were obtained in the same manner as in Example 9 except that 1.7 g of indium (purity: 99.9%) was used instead of 0.3 g of lithium (purity: 99.9%).

(Coating of Particles)

In the same manner as in Example 9, magnesium silicide particles coated with a monomolecular film were obtained.

(Sintering)

In the same manner as in Example 9, the magnesium silicide particles coated with the monomolecular film were sintered to obtain a sintered body, and a rectangular parallelepiped chip was obtained.

(Structure and Properties)

The density of the sintered body measured by Archimedes method was 98.5% with respect to the pure magnesium silicide. In addition, a cross-section of the sintered body was observed under a transmission electron microscope (TEM), and a structure in which magnesium silicide crystal grains with an average particle size of 100 nm were tightly bonded was observed.

The sintered body had an electrical conductivity of 1.2×$10^5$ S/m at 27° C., and a thermal conductivity of 7.9 W/m·K. The dopant concentration was calculated based on the Seebeck coefficient of the sintered body (99.7 μV/K) and was 0.8 in terms of [$10^{20}$ atoms/$cm^3$]. The thermoelectric performance index ZT at 527° C. was 0.82.

Example 13

(Preparation of Magnesium Silicide Particles)

Magnesium silicide particles were obtained in the same manner as Example 9 except that 1.8 g of thallium (purity 99.9%) was used instead of 0.3 g of lithium (purity 99.9%).

(Coating of Particles)

Similar to Example 9, magnesium silicide particles coated with a monomolecular film were obtained.

(Sintering)

Similar to Example 9, the magnesium silicide particles coated with a monomolecular film were sintered to obtain the sintered body, and a rectangular parallelepiped chip was obtained.

(Structure and Properties)

The density of the sintered body measured by Archimedes method was 98.5% with respect to the pure magnesium silicide. In addition, a cross-section of the sintered body was observed under a transmission electron microscope (TEM), and a structure was observed in which magnesium silicide crystal grains with an average particle size of 100 nm were tightly bonded.

The sintered body had an electrical conductivity of 1.1×$10^5$ S/m at 27° C., and a thermal conductivity of 8.0 W/m·K. The dopant concentration was calculated based on the Seebeck coefficient of the sintered body (99.3 μV/K), and was 0.8 in terms of [$10^{20}$ atoms/$cm^3$]. The thermoelectric performance index ZT at 527° C. was 0.78.

Example 14

(Preparation of Magnesium Silicide Alloy Particles)

15 g of magnesium (purity: 99.99% or higher), 3.4 g of silicon (purity: 99.99% or higher), 21 g of tin (purity 99.99% or higher), and 0.3 g of gallium (purity: 99.9%) were loaded in a punch-die jig made of graphite, a pressure heat treatment was applied under an argon atmosphere using a spark plasma sintering device, followed by cooling. The resulting mass was crushed to a size of 45 μm or less using a hammer crusher and a planetary ball mill. Further, a bead mill was used to pulverize to have a D90 size of approximately 150 nm. In the pulverizing, isopropyl alcohol was used as a medium, and zirconia beads with a diameter of 0.05 mm were used as the beads. Isopropyl alcohol was removed from the resulting slurry under reduced pressure followed by drying to provide gallium-doped magnesium silicide particles.

(Coating of Particles)

The resulting magnesium silicide alloy particles were dispersed in heptane, and decaborane was added in an amount of 0.5 g with respect to 5.0 g of the particles to obtain a mixture. The mixture was loaded in the above-described bead mill, and the mixing process was performed for 300 minutes. The heptane was then removed under reduced pressure followed by drying to obtain particles of a magnesium silicide-based alloy coated with a monomolecular film.

(Sintering)

The particles of the monomolecular film coated magnesium silicide alloy were loaded in a punch-die jig made of graphite, and then heated to 750° C. using a spark plasma sintering device to obtain a sintered body. The applied pressure was 50 MPa, and the rate of temperature rise was 50° C./minute. The surface of the sintered body was roughly polished to remove the impurity layer originated from graphite or the like. The sintered body was cut by using a dicing saw to obtain a rectangular parallelepiped chip.

(Structure and Properties)

The density of the sintered body measured by Archimedes method was 98.5% with respect to the base magnesium silicide alloy. In addition, a cross-section of the sintered body was observed under a transmission electron microscope (TEM), and a structure was observed in which crystalline grains with an average grain diameter of 100 nm were tightly bonded.

The sintered body had an electrical conductivity of $1.1\times10^5$ S/m at 27° C., and a thermal conductivity of 5.5 W/m·K. The dopant concentration was calculated based on the Seebeck coefficient of the sintered body (101.5 μV/K), and was 0.8 in terms of [$10^{20}$ atoms/$cm^3$]. The thermoelectric performance index ZT at 527° C. was 1.11.

Example 15

(Preparation of Magnesium Silicide Alloy Particles)

15 g of magnesium (purity: 99.99% or higher), 3.4 g of silicon nanoparticles (XRD crystallite size: 18 nm), 21 g of tin (purity: 99.99% or higher), and 0.3 g of gallium (purity: 99.9%) were loaded into a punch-die jig made of graphite, a pressure heat treatment was applied under an argon atmosphere using a spark plasma sintering device, followed by cooling. The resulting mass was crushed to a size of 45 μm or less using a hammer crusher and a planetary ball mill. Further, a bead mill was used to pulverize to have a D90 size of approximately 150 nm. In the pulverizing, isopropyl alcohol was used as a medium, and zirconia beads with a diameter of 0.05 mm were used as the beads. Isopropyl alcohol was removed from the resulting slurry under reduced pressure followed by drying to provide gallium-doped magnesium silicide alloy particles.

(Coating of Particles)

The resulting magnesium silicide alloy particles were dispersed in heptane, and decaborane was added in an amount of 0.5 g with respect to 5.0 g of the particles to obtain a mixture. The mixture was charged in the above-described bead mill, and the mixing process was performed for 300 minutes. The heptane was then removed under reduced pressure followed by drying to obtain particles of a magnesium silicide-based alloy coated with a monomolecular film.

(Sintering)

The particles of magnesium silicide alloy coated with the monomolecular film were loaded into a punch-die jig made of graphite, and then heated to 750° C. using a spark plasma sintering device to obtain a sintered body. The applied pressure was 50 MPa, and the rate of temperature rise was 50° C./minute. The surface of the sintered body was roughly polished to remove the impurity layer originated from graphite or the like. The sintered body was cut by using a dicing saw to obtain a rectangular parallelepiped chip.

(Structure and Properties)

The density of the sintered body measured by Archimedes method was 98.5% with respect to the base magnesium silicide alloy. In addition, a cross-section of the sintered body was observed under a transmission electron microscope (TEM), and a structure was observed in which crystalline grains with an average grain diameter of 100 nm were tightly bonded.

The sintered body had an electrical conductivity of $1.0\times10^5$ S/m at 27° C., and a thermal conductivity was 4.8 W/m·K. The dopant concentration was calculated based on the Seebeck coefficient of the sintered body (102.3 μV/K), and was 0.8 in terms of [$10^{20}$ atoms/$cm^3$]. The thermoelectric performance index ZT at 527° C. was 1.30.

Examples 1 to 15 showed that both n-type and p-type semiconductor crystals exhibited a low thermal conductivity and a high electrical conductivity, and thus materials with high thermoelectric performance were obtained. In particular, in Examples 6-8, 14, and 15, which were sintered bodies containing an alloy including tin, a material having a high thermoelectric performance of higher than 1 was obtained.

The present application is based on and claims priority to Japanese Patent Application No. 2017-100107 filed on May 19, 2017; Japanese Patent Application No. 2017-100108 filed on May 19, 2017; and Japanese Patent Application No. 2017-199057 filed on Oct. 13, 2017, the entire contents of which are hereby incorporated by reference.

The invention claimed is:

1. A method of producing a semiconductor sintered body comprising:

a step of preparing particles including magnesium silicide or an alloy containing magnesium silicide and having an average particle size of 1 μm or less;

a step of forming a coating including a dopant element, on a surface of the particles, and a step of sintering the particles with the coating formed on the surface to obtain a semiconductor sintered body.

2. The method according to claim 1, wherein the dopant element comprises one or more selected from phosphorus, arsenic, antimony, and bismuth.

3. The method according to claim 1, wherein the dopant element comprises one or more selected from boron, aluminum, gallium, indium, and thallium.

4. The method according to claim 1, wherein the step of sintering is performed at a temperature of 600° C. or higher.

5. The method according to claim 1, wherein the step of sintering comprises spark plasma sintering.

* * * * *